United States Patent [19]

Sekihara et al.

[11] Patent Number: 4,672,318

[45] Date of Patent: Jun. 9, 1987

[54] METHOD OF MEASURING THE STATIC MAGNETIC FIELD DISTRIBUTION IN AN NMR INSPECTION SYSTEM

[75] Inventors: Kensuke Sekihara; Etsuji Yamamoto, both of Hachioji; Shigeru Matsui, Koganei; Hideki Kohno, Tokyo, all of Japan

[73] Assignee: Hitachi, Ltd., Tokyo, Japan

[21] Appl. No.: 696,909

[22] Filed: Jan. 31, 1985

[30] Foreign Application Priority Data

Feb. 1, 1984 [JP] Japan .................................. 59-15175

[51] Int. Cl.$^4$ ............................................. G01R 33/20
[52] U.S. Cl. .................................. 324/307; 324/320; 324/309
[58] Field of Search ............... 324/300, 307, 309, 313, 324/318, 319, 320, 322, 312; 128/653

[56] References Cited

U.S. PATENT DOCUMENTS

| | | | |
|---|---|---|---|
| 4,510,449 | 4/1985 | Ernst et al. | 324/309 |
| 4,583,044 | 4/1986 | Case et al. | 324/309 |
| 4,585,992 | 4/1986 | Maudsley et al. | 324/320 |

FOREIGN PATENT DOCUMENTS 2143041  1/1985  United Kingdom ................ 324/307

OTHER PUBLICATIONS

A. A. Maudsley et al., Rapid ... Magnetic Resonance, Siemens Forsch u. Entwickl. Ber. 8,Nr.6, pp. 326–331, 1979.

Primary Examiner—Stewart J. Levy
Assistant Examiner—Scott M. Oldhan
Attorney, Agent, or Firm—Antonelli, Terry & Wands

[57] ABSTRACT

A method of measuring a static magnetic field distribution in a nuclear magnetic resonance (NMR) inspection system which comprises magnetic field generator for producing a static magnetic field, inclination or gradient magnetic fields and a high-frequency magnetic field, a signal detector for sensing nuclear magnetic resonance signals from an inspection sample, a computer for processing output signals from the signal detector and an output device for providing a computational result of the computer, wherein a time interval $t_1$ from the center of a 90°-pulse high-frequency magnetic field to the center of a 180°-pulse high-frequency magnetic field is made different by a time difference $t_0$ from a time interval $t_2$ from the center of the 180°-pulse high-frequency magnetic field to a peak of a spin echo, so that static magnetic field distribution is calculated based on the computer output which corresponds to the difference of the two time intervals.

6 Claims, 7 Drawing Figures

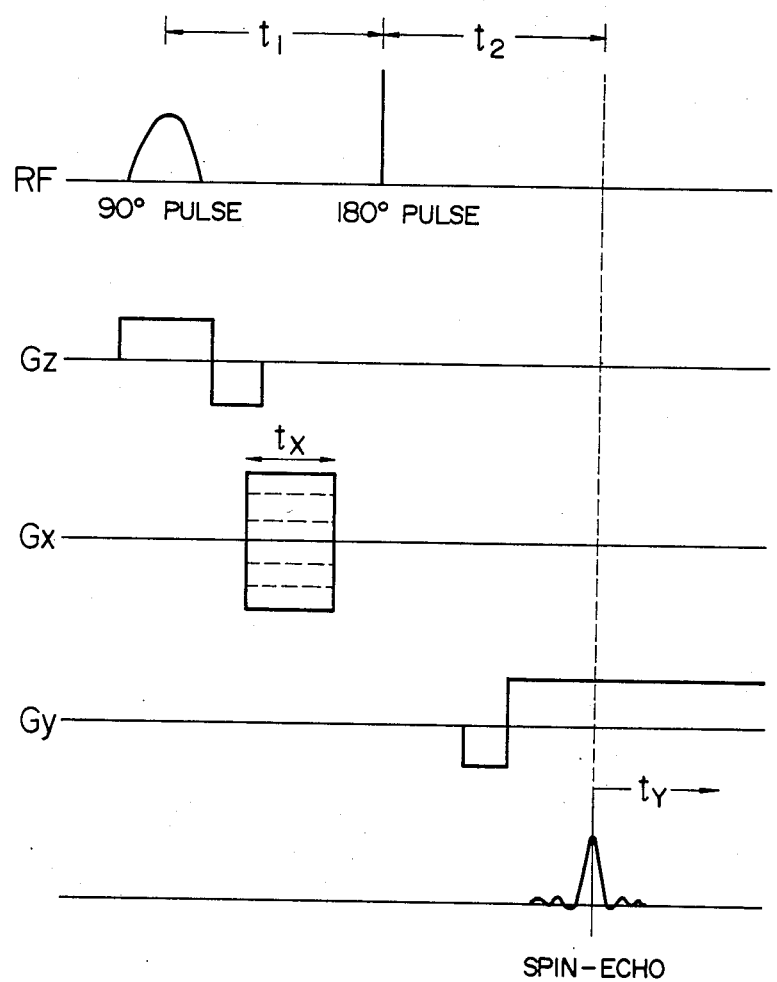

SPIN-ECHO

A/D

A/D

METHOD OF MEASURING THE STATIC MAGNETIC FIELD DISTRIBUTION IN AN NMR INSPECTION SYSTEM

BACKGROUND OF THE INVENTION

The present invention relates to a method of measuring the static magnetic field distribution in a nuclear magnetic resonance (NMR) inspection system which measures the nuclear spin distribution and relaxation time distribution inside a 3-dimensional substance such as a biological substance by utilization of the NMR phenomena.

The NMR phenomena discovered in 1946 coincidently by Bloch and Purcell are now indispensable means of analysis in the fields of physics and chemistry, including the structural analysis of substances.

Application of the NMR phenomena to the imaging technique has first been attempted by Lauterbur in 1974. Thereafter, various NMR imaging methods have been developed, and at present the pulse method providing a satisfactory measuring accuracy and S/N ratio is dominant.

In the NMR imaging technique, it is necessary to have a uniform static magnetic field distribution so as to obtain images without distortion. For measuring the static magnetic field distribution, there is known the 3-dimensional Fourier transform imaging method. (Refer to A. A. Maudsley et al, "Rapid Measurement of Magnetic Field Distributions Using Nuclear Magnetic Resonance", Siemens R/D Report vol. 8, pp. 326–331 (1979)).

FIG. 1 shows the sequence for practicing the above-mentioned method. In the figure, $G_x$ and $G_y$ represent the phase-encoding gradients, and the image is formed on the x-y plane. The 3-dimensional Fourier transformation for 3-dimensional signal $F(G_x, G_y, t)$ obtained through the measurement gives NMR spectrum at each point of the image. Accordingly, by plotting the frequencies at peaks of the spectrum at each point of the image using a phantom containing water uniformly, the static magnetic field can be mapped.

Although the above method is advantageous in that the disparity of the sensitivity of the irradiation and detection coils does not affect the measurement result, it needs the observation of at least as many FID signals as the number of measuring points, resulting in a problem of a longer measurement time.

SUMMARY OF THE INVENTION

In view of the foregoing circumstances, it is an object of the present invention to overcome the aforementioned prior art deficiencies and provide a method of measuring the static magnetic field distribution in an NMR inspection system capable of measuring the static magnetic field distribution within the measuring region in a short time.

The above objectives are accomplished by the use of an NMR inspection system comprising magnetic field generating means for producing a static magnetic field, inclination magnetic field and high-frequency magnetic field, a signal detection means for sensing nuclear magnetic resonance signals from an inspection sample, a computer for processing the output signals of the signal detection means, and an output means for providing the computational result obtained by the computer, and in conjunction through the application of the method of measuring the static magnetic field distribution, wherein the time interval from the application of a 90°-pulse high-frequency magnetic field to the application of a 180°-pulse high-frequency magnetic field is made different from the time interval from the application of the 180°-pulse high-frequency magnetic field to the formation of a spin echo, so that the static magnetic field distribution is calculated based on the computer output which corresponds to the difference between the above two time intervals.

BRIEF DESCRIPTION OF THE DRAWINGS

FIGS. 3 and 4 are diagrams showing pulse sequences used by the inventive measuring method.

DESCRIPTION OF THE PREFERRED EMBODIMENTS

Figure 1:
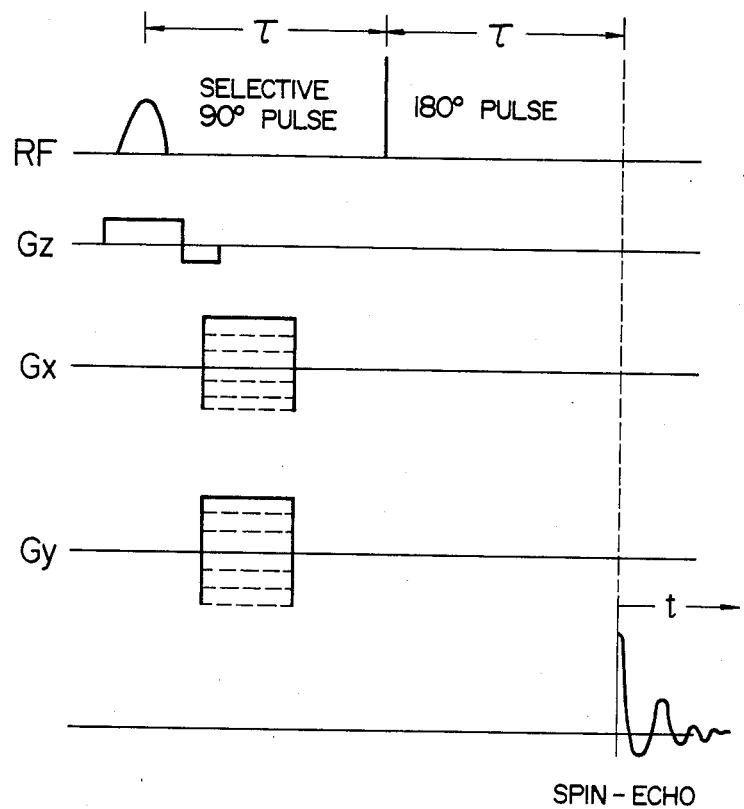
FIG. 1 is a diagram showing the pulse sequence used in the conventional measuring method.
Figure 2:
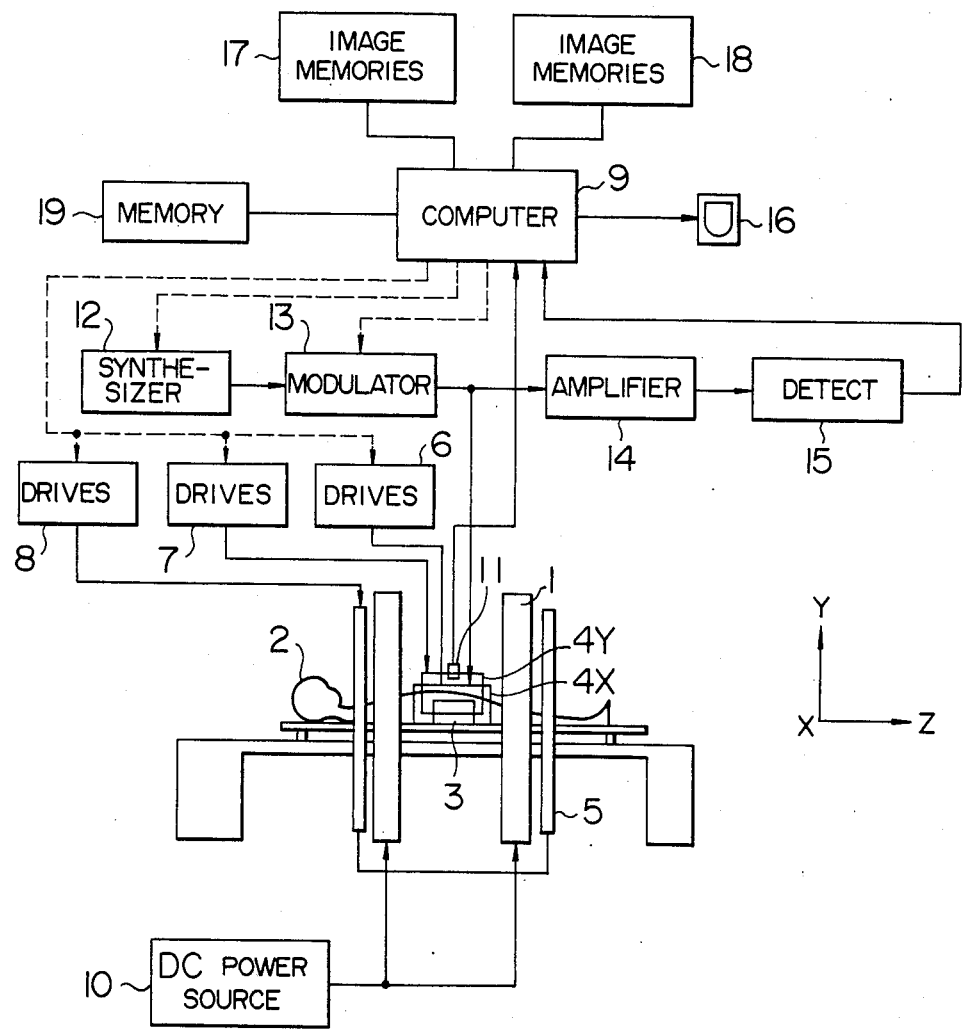
FIG. 2 is a systematic diagram of the NMR inspection system to which the inventive measuring method is applied.

An embodiment of the present invention will now be described in detail with reference to the drawings. The NMR imaging system of FIG. 2 used in this embodiment includes a winding 1 for producing a static magnetic field $H_0$, a sample 2 to be measured, a sensing coil 3 which produces a high-frequency magnetic field and detects signals created by the sample 2, windings 4X and 4Y for producing inclination or gradient magnetic fields in the x and y directions, a winding 5 for producing an inclination or gradient magnetic field in the z direction, and a d.c. power source 10. The windings 4X, 4Y and 5 for producing inclination magnetic fields are energized by associated drive units 6, 7 and 8 operating under control of a computer 9. The computer 9 is linked with image memories 17 and 18.

A high-frequency signal generated by a synthesizer 12 is shaped and amplified in a modulator 13, and then fed to the sensing coil 3, and a high-frequency magnetic field for exciting a nuclear spin is produced. Signals from the sample 2 are received by the sensing coil 3, amplified by an amplifier 14, subjected to orthogonal detection by a detector 15, and then entered to the computer 9. The computer 9 processes the signals and displays an image based on the density distribution or relaxation time distribution on a CRT display unit 16.

The sample 2 is placed inside the winding 1 so that a high-frequency magnetic field and inclination magnetic fields are applied to the sample 2. The measurement takes place as follows.

Figure 3:
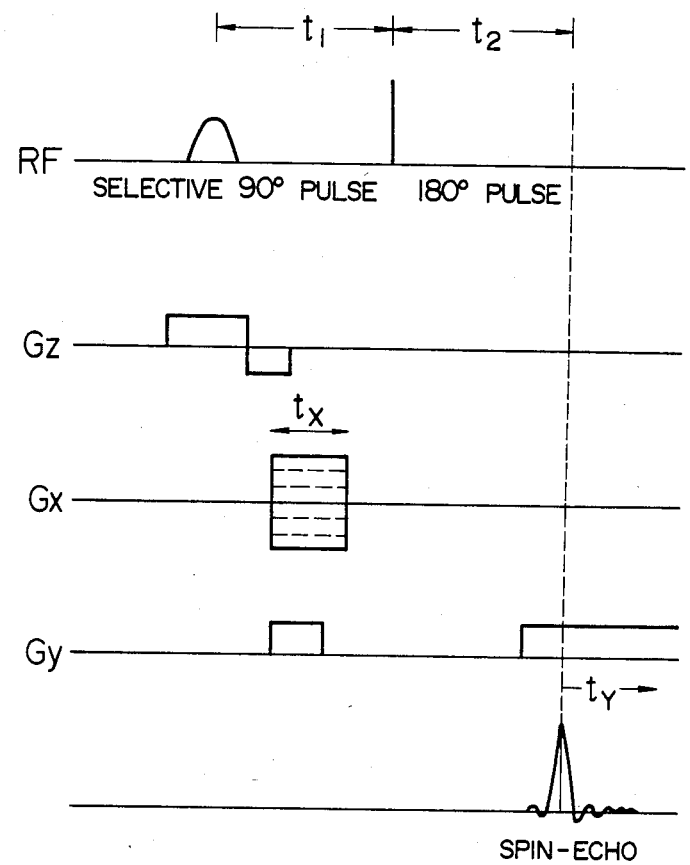

FIGS. 3 and 4 show the pulse sequences used in this embodiment. Here, the imaging plane is set to the x-y plane with an intent to image a specific cross-section of the sample in a direction perpendicular to the z direction. The difference between the pulse sequences of FIGS. 3 and 4 resides in the way of applying a dummy in forming a spin echo by the read-out gradient Gy. In the case of FIG. 3, a dummy with a polarity common to the read-out polarity is applied in advance of the 180° pulse, while in the case of FIG. 4 a dummy with the opposite polarity is applied immediately before the read-out, so as to form a spin echo. This is not a significant difference, and the following discussion will solely refer to FIG. 3 as an example.

Assuming $t_1 = t_2$ in FIG. 3, when the static magnetic field distribution is completely uniform, there is a relationship between the measured 2-dimensional signal $F(G_x, t_y)$ and the spin density distribution $C(x, y)$, as follows.

$$F(G_x, t_y) = \int C(x,y) \exp\{i\gamma(G_x x t_x - G_y y t_y)\} dx dy \qquad (1)$$

In the expression, $G_x$ denotes the phase encoding magnetic field gradient having different amplitude at each application, and $G_y$ denotes the magnetic field gradient for read-out.

On the other hand, when the static magnetic field has an error distribution $E(x, y)$ within the view, the static magnetic field can be expressed as:

$$H_0 + E(x,y)$$

In this case, the measured 2-dimensional signal $F(G_x, t_y)$ becomes:

$$\begin{aligned} F(G_x, t_y) = & \int C(x,y) \\ & \exp\{i\gamma[G_x x t_x + (E(x,y) + G_y y) t_y]\} dx dy \end{aligned} \qquad (2)$$

On assumption that the phase detection at a frequency being:

$$f_0 = \frac{\gamma}{2\pi} H_0$$

Accordingly, on assumption that $G_y$ is sufficiently larger than $E(x, y)$, the above equation can fairly be approximated by equation (1).

If, on the other hand, a relationship of $t_1 = t_2 + t_0$ is assumed, the above equation (2) becomes:

$$F(G_x, t_y) = \int C(x, y) \exp\{i\gamma[E(x, y) t_0 + G_x \times t_x + (E(x, y) + G_y y) t_y]\} dx dy \qquad (3)$$

If a sufficiently large $G_y$ is assumed again, image $S(x, y)$ obtained through the 2-dimensional Fourier transformation for the above $F(G_x, t_y)$ becomes:

$$S(x,y) = C(x,y) e^{i\gamma E(x,y) t_0} \qquad (4)$$

Namely, as a result of the measurement, information on the static magnetic field is included as a phase shift in the image, and therefore the static magnetic field distribution can be calculated from the phase shift.

By choosing $t_0$ to be:

$$|\gamma E x, y) t_0| < \pi/2$$

$E(x,y)$ can be evaluated uniquely by one of the following equations.

$$E(x, y) = \frac{1}{\gamma t_0} \tan^{-1}\left[\frac{I_m [S(x, y)]}{R_e [S(x, y)]}\right] \qquad (5)$$

$$E(x, y) = \frac{1}{\gamma t_0} \sin^{-1}\left[\frac{I_m [S(x, y)]}{|S(x, y)|}\right] \qquad (5)'$$

$$E(x, y) = \frac{1}{\gamma t_0} \cos^{-1}\left[\frac{R_e [S(x, y)]}{|S(x, y)|}\right] \qquad (5)''$$

Although equation (5)" has a drawback that it cannot discriminate the polarity of a shift from the reference value, the three equations have no significant differences. The following discussion is expediently based on the use of equation (5), but the present invention is not limited to this case.

Figure 5A:
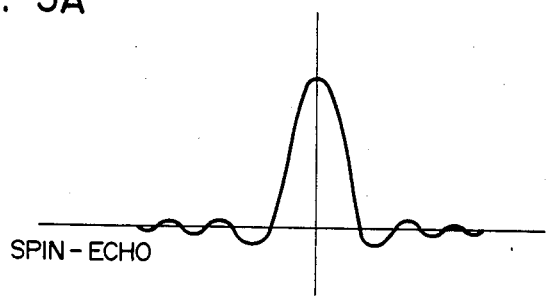
FIGS. 5A, 5B and 5C are diagrams used to explain the method of measuring the spin echo.
Figure 5B:
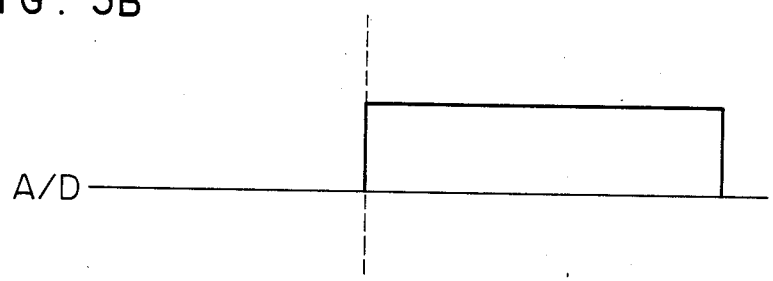
Figure 5C:
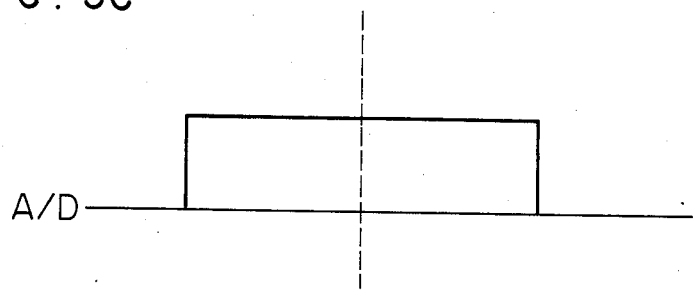

There are two known methods for the measurement of the spin echo, as shown in FIGS. 5B and 5C, respectively. FIG. 5B is the method of measuring the latter half of a spin echo as shown in FIG. 5A, while FIG. 5C is the method of measuring the whole echo in a symmetric time domain with respect to the center of the echo. NMR analyzers usually employ the method of FIG. 5B, and NMR imaging systems usually employ the method of FIG. 5C. In practicing the present invention, the method of FIG. 5C is advantageous since the imaginary image is not affected by the dispersing waveform, but the measurement based on the method of FIG. 5B is also possible by using the symmetry possessed by the spin echo waveform as:

$$F(G_x, -t_y) = F(-G_x, t_y)^*$$

where symbol "*" signifies a conjugate complex.

Various imperfections of the NMR imager affect the image in the form of a phase error. As can be seen from equation (4), such a phase error directly affects the final result of computation for the $E(x, y)$. On this account, the imaging system must be rendered a complete adjustment for eliminating the phase error before practicing the present invention. Residual error left by the adjustment can be removed by the following method.

Equation (4) including a phase error $\epsilon$ gives:

$$S(x,y) = C(x,y) e^{i\{\gamma E(x,y) t_0 + \epsilon\}} \qquad (6)$$

Accordingly, image $S_0(x, y)$ at $t_0 = 0$ is given as:

$$S_0(x,y) = C(x,y) e^{i\epsilon} \qquad (7)$$

Using this $S_0(x, y)$ in equation (5) gives:

$$E(x, y) = \frac{1}{\gamma t_0}\left(\tan^{-1}\left\{\frac{I_m [S(x, y)]}{R_e [S(x, y)]}\right\} - \tan^{-1}\left\{\frac{I_m [S_0(x, y)]}{R_e [S_0(x, y)]}\right\}\right) \qquad (8)$$

Thus, the result without error can be reached even using an imaging system in imperfect adjustment.

The following describes the procedure of measurement more practically.

First, by assuming the maximum value of the anticipated magnetic field error distribution to be $E_{max}$, $t_0$ is chosen so that $|\gamma E_{max} t_0| < \pi/2$. That is, the approximate value of the $E_{max}$ needs to be known in advance. For example, $t_0$ is around 1 ms for the case of $E_{max} = 0.05$ Gauss.

Image $S(x, y)$ is calculated for the value of $t_0$, and its real part $R_e [S(x, y)]$ and imaginary part $I_m [S(x, y)]$ are stored in the image memories 17 and 18, respectively. Then, using the stored real and imaginary parts the value of $\tan^{-1} I_m [S(x, y)]/R_e [S(x, y)]/(t_0 \gamma)$ is calculated for all pixel points. When the fulfillment of the condition $|\gamma E_{max} t_0| < \pi/2$ is to be assured, the polarity of $R_e [S(x, y)]$ should be checked at all pixel points to find it is entirely positive. If a negative region is found in $R_e[S(x, y)]$, the $t_0$ should be made smaller, and the aforementioned measurement is repeated.

In order to modify the above-mentioned phase error using $S_0(x, y)$, image $S_0(x, y)$ is measured for $t_0=0$, and computational results of $\tan^{-1}[I_m[S_0(x, y)]]/R_3[S_0(x, y)]]$ at each pixel point are stored in memory 19. Then, using these data, $E(x, y)$ is calculated by equation (8).

The value of $E(x, y)$ obtained through the above procedure does not show an accurate magnetic field distribution, but it is distorted due to the magnetic field error. This distortion can mostly be eliminated by the following method.

When the measured magnetic field error distribution evaluated through the above procedure is $E_0(x, y)$ and the true magnetic field error distribution is $E_R(x, y)$, the distortion can be expressed by the following coordinate transformation.

$$\begin{aligned} x' &= x \\ y' &= y + \frac{1}{G_y} E_R(x, y) \end{aligned} \quad (9)$$

That is, data which should inherently be measured at $(x, y)$ is found at $(x', y')$ given by the above equation (9). Accordingly, the distortion can reversely be modified using the equation (9).

In practice, this modification is carried out as follows. An image is measured at discrete points, and therefore the magnetic field error distribution can also be obtained at discrete points. The magnetic field error distribution is expressed as $E_0(I, J)$. With the pixel size of P in the y direction, the following equation (10) is calculated using the error distribution data.

$$g = J + \frac{1}{G_y P} E_0(I, J) \quad (10)$$

Then equations (11) are calculated.

$$\begin{aligned} J' &= [g] \\ D &= g - J' \end{aligned} \quad (11)$$

where brackets denote the Gaussian symbol.

Using the above equations, the following equation (12) is calculated.

$$E_1(I,J) = (1-D)E_0(I,J') + DE_0(I,J'+1) \quad (12)$$

The $E_1(I, J)$ obtained by equation (12) has been modified for the distortion using $E_0(I, J)$ in place of the true value $E_R(I, J)$, and it is approximate to the $E_R(I, J)$. For further upgrading the accuracy of modification, the $E_1(I, J)$ is used to calculate the following equation (13), and the $E_1(I, J)$ is recalculated by equations (11) and (12). The accuracy of modification is enhanced through the repetition of these calculations.

$$g = J + \frac{1}{G_y P} E_1(I, J) \quad (13)$$

Although in the foregoing embodiment memories 17 and 18 are provided for storing data used in the calculations, the memories may be ones that are used in other forms. It is needless to say that the present invention is not limited to the foregoing embodiment.

As described above, the present invention realizes the method of measuring the static magnetic field distribution in an NMR inspection system which comprises magnetic field generating means for producing a static magnetic field, inclination or gradient magnetic fields and a high-frequency magnetic field, a signal detection means for sensing nuclear magnetic resonance signals from an inspection sample, a computer for processing the signals detected by the signal detection means, and an output means for providing the computational result of the computer, wherein the time interval from the application of a 90°-pulse high-frequency magnetic field to the application of a 180°-pulse high-frequency magnetic field is made different from the time interval from the application of the 180°-pulse high-frequency magnetic field to the formation of a spin echo, so that the static magnetic field distribution is calculated based on the computer output which corresponds to the difference of the above two time intervals, whereby the static magnetic field distribution within the measuring region can be measured in a short time.

We claim:

1. A method of measuring a static magnetic field distribution in a field of view of a nuclear magnetic resonance (NMR) inspection system which comprises magnetic field generating means for producing a static magnetic field, gradient magnetic fields and a high-frequency magnetic field, signal detection means for sensing nuclear magnetic resonance signals from an inspection sample, a computer for processing output signals from said signal detection means and output means for providing a computational result of said computer, said method comprising the steps of:

(a) exciting nuclear spins in a sample which is disposed in said field of view by applying a 90°-pulse high frequency magnetic field;

(b) applying a first gradient magnetic field pulse along a first direction;

(c) applying a 180°-pulse high frequency magnetic field;

(d) applying second and third gradient magnetic field pulses along at least a second direction perpendicular to said first direction so that a spin echo is formed during said third gradient magnetic field pulse and that a time interval $t_1$ from the center of said 90°-pulse high frequency magnetic field to the center of said 180°-pulse high frequency magnetic field is made different by a time difference $t_0$ from a time interval $t_2$ from the center of said 180°-pulse high frequency magnetic field to a peak of said spin echo;

(e) sampling the signal from said signal detection means during said third gradient magnetic field pulse to obtain data of said spin echo;

(f) repeating the above-described steps (a) to (e) and in each repetition of time changing the amplitude of said first gradient magnetic field pulse while maintaining the amplitude of said second and third gradient magnetic field pulses unchanged;

(g) deriving image data through 2-dimensional Fourier transformation of data obtained by the repetition of the steps; and (h) calculating a static magnetic field distribution from a phase shift of said image data caused by said time difference $t_0$.

2. A method of measuring a static magnetic field distribution according to claim 1, wherein said time difference $t_0$ is selected so that said phase shift of said image data becomes smaller than $\pi/2$.

3. A method of measuring a static magnetic field distribution according to claim 1, wherein said step of calculating includes utilizing both a real part of said image data and an imaginary part of said image data.

4. A method of measuring a static magnetic field distribution according to claim 1, wherein said step of calculating includes utilizing an imaginary part of said image data and an absolute value of said image data.

5. A method of measuring a static magnetic field distribution according to claim 1, wherein said step of calculating includes utilizing a real part of said image data and an absolute value of said image data.

6. A method of measuring a static magnetic field distribution according to claim 1, further including the step of deriving a phase error caused by an imperfection of said nuclear magnetic resonance inspection system, which includes performing the steps (a) to (g) with no time difference $t_0$, wherein said step of calculating includes a step of correcting said phase error of said phase shift of said image data caused by said time difference $t_0$.

* * * * *